(12) United States Patent
Deninger et al.

(10) Patent No.: US 7,024,321 B1
(45) Date of Patent: Apr. 4, 2006

(54) BATTERY MONITORING SYSTEM WITH LOW POWER AND END-OF-LIFE MESSAGING AND SHUTDOWN

(75) Inventors: Daniel A. Deninger, Carlsbad, CA (US); Huey Trando, Santee, CA (US); Michael Lockerman, San Diego, CA (US); Anthony M. Richards, San Diego, CA (US); Mark D. Parisi, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 750 days.

(21) Appl. No.: 09/619,863

(22) Filed: Jul. 20, 2000

(51) Int. Cl.
    *G01R 31/36*      (2006.01)

(52) U.S. Cl. .......................... 702/63; 320/113

(58) Field of Classification Search ............ 702/57, 702/63, 64, 65, 117, 118, 122, 124, 126, 182, 702/183, 184, 134, 135, 170, 171; 320/113; 713/340; 600/300
See application file for complete search history.

(56) References Cited

U.S. PATENT DOCUMENTS

| | | | |
|---|---|---|---|
| 4,916,613 A | | 4/1990 | Lange et al. |
| 5,406,266 A | | 4/1995 | Mino et al. |
| 5,514,946 A | | 5/1996 | Lin et al. |
| 5,684,404 A | | 11/1997 | Millar et al. |
| 5,802,379 A | | 9/1998 | Boatwright et al. |
| 5,845,142 A | * | 12/1998 | Hayasaka ............ 713/340 |
| 5,929,601 A | * | 7/1999 | Kaib et al. .......... 320/113 |
| 6,406,426 B1 | * | 6/2002 | Reuss et al. .......... 600/300 |

FOREIGN PATENT DOCUMENTS

| | | |
|---|---|---|
| EP | 0665443 | 8/1995 |
| GB | 2341760 | 3/2000 |

OTHER PUBLICATIONS

Balough, Laszlo, "Implementing Multi–State Charge Algorithm with the UC3909 Switchmode Lead–Acid Battery Charger Controller", Unitrode Corporation, Texas Instruments Inc.,1999.

"Lead–Acid Fast–Charge IC", bq2031, Benchmarq Products, Texas Instruments Inc., Jun., 1999.

Fleming, Frank A. et al., "Rapid Recharge Capability of Valve Regulated Lead Acid Batteries for EV & HEV Applications", Hawker Energy Publication, 1999.

Jana, Kalyan, "Charging Pure Lead–Tin Batteries: A Guide for CYCLON and Genesis Products", Hawker Energy Publication, First Edition, pp. 8–14, Mar. 1999.

"U–510 Using the bq2031 to Charge Lead–Acid Batteries", Unitrode Corporation, Texas Instruments, Oct., 1997.

* cited by examiner

*Primary Examiner*—Marc S. Hoff
*Assistant Examiner*—Mohamed Charioui
(74) *Attorney, Agent, or Firm*—Philip R. Wadsworth; Charles D. Brown; Thomas M. Thibault

(57) ABSTRACT

A battery monitoring apparatus that senses battery conditions such as low battery charge, end of battery capacity, and end of battery life, and responds by taking actions such as sending messages to a remote site and/or powering down. A rechargeable battery is coupled to one or more power-consuming electrical components, including battery monitoring equipment. The battery monitoring equipment senses battery charge. In response to a low-battery-charge condition, the battery monitoring equipment transmits a battery status message to a remote site and powers-down some of the electrical components. Whenever the battery nears the end of its capacity, the monitoring equipment powers down all electronic components and awaits the application of external power. The invention also tracks the time required for the battery charge to deplete. Charge duration decreases over time, and whenever it reaches a predetermined minimum, the battery monitoring equipment transmits a representative status message to the remote site.

28 Claims, 9 Drawing Sheets

BATTERY MONITORING SYSTEM WITH LOW POWER AND END-OF-LIFE MESSAGING AND SHUTDOWN

BACKGROUND OF THE INVENTION

1. Field of the Invention

The present invention relates to the use and charging of rechargeable batteries. More particularly, the invention concerns an unattended battery monitoring system that detects battery conditions such as low charge and impending end-of-battery-life, and responds by taking actions such as sending messages to a remote site and/or shutting down various battery-powered electrical components.

2. Description of the Related Art

Along with increased computing power, portability has been an important hallmark of the electronic age. Some electronic products are manufactured in handheld packages today, where the same component in past years occupied an entire room. Such portability would be meaningless without the availability of similarly portable power supplies, so it is no surprise that batteries have also undergone significant development in storage capability, compactness and other features.

One especially significant development in this area is the rechargeable battery. With rechargeable batteries, an electrically powered device can run for longer without the inconvenient and sometimes expensive task of removing and replacing batteries. In fact, many devices permit battery recharging without removing the batteries. And, if a source of occasional recharging is naturally available, rechargeable batteries can be used to power unattended or remotely located devices, thereby offering even greater convenience and longevity. One such example includes devices that are occasionally recharged with electricity generated by solar or wind energy.

Another example is the cellular untethered TrailerTRACS® product of Qualcomm Inc. The untethered TrailerTRACS product includes a self-contained freight module installed at a freight car such as a semi-tractor trailer. The freight module senses and transmits various status reports regarding trailer position, load, door status, and the like. Each TrailerTRACS module automatically receives recharging power when it is attached to a tractor, and consumes power when it is unattached or "untethered." Rechargeable batteries provide the TrailerTRACS modules with a greater degree of longevity and self-sufficiency than would be otherwise possible. In some cases, untethered trailers sit dormant for months while their TrailerTRACS modules continue to provide various trailer-related status reports.

Although the TrailerTRACS product yields a number of significant benefits, and even enjoys widespread commercial use today, engineers at Qualcomm Inc. are nonetheless interested in improving the performance and efficiency of the battery monitoring and recharging processes in TrailerTRACS and other unattended products that use rechargeable batteries. Some areas of possible focus concerns improving the ability to monitor and manage battery use, and thereby ensure the availability of sufficient battery power for unattended battery-powered equipment. Monitoring and carefully managing battery use are important because the consequences of poor battery monitoring and management can be severe. For instance, if an unattended TrailerTRACS battery unexpectedly runs out of power, the TrailerTRACS equipment stops transmitting its normal position reports and therefore disappears from remote monitoring equipment, defeating one important benefit normally enjoyed by TrailerTRACS customers. Furthermore, if a battery reaches the end of its life, subsequent recharging cannot prevent the battery from quickly returning to a low charge condition in a relatively fast time, such as one day, thus increasing the possibility of an unexpected, future power loss. Furthermore, technicians must be immediately dispatched to remove and replace the expired battery, despite the resultant inconvenience and labor costs.

As mentioned above, poor battery monitoring and management can result in higher operating costs, inconvenience, and loss of services. Unfortunately, engineers face numerous challenges in trying to develop improved battery monitoring and management techniques. For example, manufacturers' product data sheets often lack accurate information concerning battery charging requirements. In some cases, product data sheets specify battery replacement after a specific number of years of operation. However, depending upon the manner of battery operation, batteries can last notably shorter or longer than expected. If battery life is shorter, the user can suffer an unexpected, premature battery failure. If battery life is longer than expected, the user may replace the battery sooner than necessary, incurring unnecessary replacement costs.

Consequently, known rechargeable battery monitoring and management schemes are not always adequate due to certain unsolved problems.

SUMMARY OF THE INVENTION

Broadly, the present invention concerns a battery monitoring apparatus that senses battery conditions such as low battery charge, end of battery capacity, battery life and end of battery life, and responds by taking actions such as sending messages to a remote site and/or shutting down certain battery-powered components. More particularly, a rechargeable battery is coupled to one or more power-consuming electrical components, as well as various battery monitoring equipment. Among other functions, the battery monitoring equipment repeatedly senses battery charge. In response to a low-battery-charge condition (such as a predetermined battery voltage), the battery monitoring equipment transmits a battery-needs-charge message to a remote site and powers-down at least some of the electrical components. Whenever the battery nears the end of its capacity, the monitoring equipment powers down all electronic components and awaits the application of external power. No messages are sent because of the battery's critically low charge.

The invention also tracks the battery's charge duration, which may also be called charge "depletion" time. A battery's charge duration naturally decreases over time, and whenever it reaches a predetermined minimum, this marks the battery's probable imminent failure. Accordingly, when this occurs, the battery monitoring equipment transmits a battery-needs-replacement message to the remote site. This predetermined minimum charge duration may be empirically adjusted upon examination of replaced batteries to determine the actual battery life remaining. Some additional features include retracting erroneous battery status messages such as those caused by temperature slew, including geographical position reports in transmitted messages reporting battery replacement, and reporting battery charge duration at various times.

The foregoing features may be implemented in a number of different forms. For example, the invention may be implemented to provide a method of monitoring a rechargeable battery's condition and managing battery operation. In another embodiment, the invention may be implemented to provide an apparatus, such as a battery monitoring and management apparatus. In still another embodiment, the invention may be implemented to provide a signal-bearing medium tangibly embodying a program of machine-readable instructions executable by a digital data processing apparatus to monitor battery condition and manage battery operation. Another embodiment concerns logic circuitry having multiple interconnected electrically conductive elements configured to monitor battery condition and manage battery operation as explained herein.

The invention affords its users with a number of distinct advantages. In general, the invention helps ensure the availability of sufficient battery power for unattended battery-powered equipment by improving the ability to accurately monitor and manage battery use. Thus, the invention helps avoid the situation where unattended electronic equipment unexpectedly runs out of power. In addition, the invention helps technicians conduct more timely battery replacement operations, saving labor costs and avoiding the costs of premature battery replacement. As an important benefit, the invention monitors the actual condition of remotely located batteries, thereby avoiding the need for engineers to rely on battery manufacturing data sheets and manufacturer's predictive estimates of battery lifetime. The invention also provides a number of other advantages and benefits, which should be apparent from the following description of the invention.

DETAILED DESCRIPTION

The nature, objectives, and advantages of the invention will become more apparent to those skilled in the art after considering the following detailed description in connection with the accompanying drawings.

Hardware Components & Interconnections
Overall Structure

Figure 1:
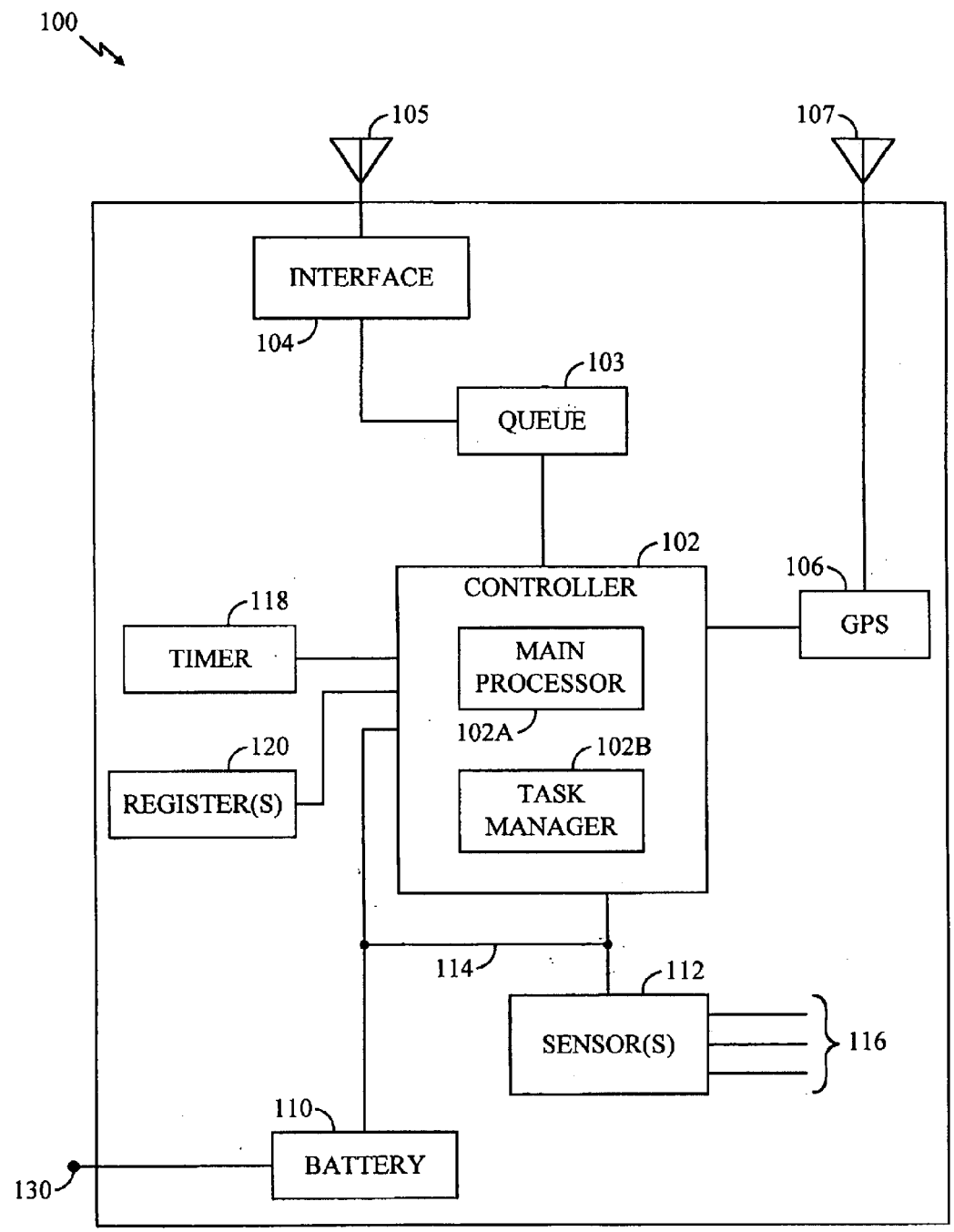
FIG. 1 is a block diagram of the hardware components and interconnections of an unattended, battery-powered trailer status reporting system, according to the invention.

Broadly, one aspect of the invention concerns an unattended battery monitoring and management system, which transmits various status reports and manages battery powered equipment according to battery properties such as battery charge and remaining life. Although this battery monitoring equipment may be used in various applications, the present description utilizes the exemplary context of an unattended, battery-powered trailer status reporting apparatus 100, as shown in FIG. 1.

Generally, the apparatus 100 is mounted upon or inside a freight car such as a semi-tractor trailer, and serves to transmit various status reports concerning the trailer's location and condition, as explained in greater detail below. The apparatus 100 includes a controller 102, interface 104, global positioning system (AGPS") receiver 106 antennas 105/107, timer 118, one or more register(s) 120, and one or more sensor(s) 112. Importantly, the apparatus 100 also includes a rechargeable battery 110, which may be of Lead-acid or another type that is suitable to the types of electrically powered equipment in the apparatus 100. The battery 110 is electrically coupled to a connector 130 shaped for attachment to a recharging source. As an example, the recharging source may comprise an external power source such as a larger battery, alternating current input, dedicated direct-current charging line, source of generated power (such as solar, wind, etc.), and the like.

The controller 102 receives its power from the battery 110, and serves to supervise and coordinate operations of the remaining components in the apparatus 100. The controller 102 may be implemented by various types of circuit components, as explained below in greater detail. For power management reasons, the controller 102 may be optionally implemented by two separate processing units. One of these units is a task manager 102b, which comprises an always-on, lower-power-consumption unit that performs simple operations such as receiving input from the sensors 112, making records in the registers 120, etc. The other processing unit is the main processor 102a, which comprises a higher-power-consumption unit that is only powered-up when needed for complex operations such as mathematical computations and input/output operations, as well as any time recharging power is available.

Attached to the controller 102 is the interface 104, which utilizes the antenna 105 to transmit and receive messages in a wireless format that is suitable for the particular application at hand. In one embodiment, the interface 104 comprises a frequency modulated (AFM") transceiver capable of communications using analog cellular radiotelephone frequencies. In addition, the present invention also contemplates other embodiments of the interface 104, such as a GlobalStar™ satellite communication transceiver, digital cellular transceiver, digital personal communication system (APCS") transceiver, two-way radio, or other suitable equipment.

Regardless of the implementation choice, the interface 104 is used to transmit status messages to a remote communications site such as a central facility that monitors trailer activity. This remote communication site may be referred to as a "network management center." If desired, a queue 103 may be functionally or structurally interposed between the controller 102 and interface 104 for the purpose of enqueueing outgoing messages for later transmission by the interface 104. Also attached to the controller 102 is the GPS receiver 106, which utilizes the antenna 107 to receive signals from GPS satellites. Using these satellite signals, the GPS receiver 106 determines the geographical location of the apparatus 100 and provides a representative position output to the controller 102.

The sensors 112 include one or more hardware devices configured to sample various attributes of the apparatus 100 and its operating environment. For instance, the sensors 112 may include appropriate hardware devices to detect various trailer-related properties such as cargo refrigerator ("reefer") temperature, trailer door open/shut, cargo location and/or volume, trailer attachment to truck tractor, trailer verification, drop-and-hook information, ambient temperature, trailer identity, and the like. The sensors 112 may also include various battery sensors to sample battery-related attributes such as battery voltage, battery current, battery temperature, etc. The sensors 112 are coupled to their respective sensing sites (not shown) by links 116, each of which may comprise a wire, cable, bus, backplane, fiber optic link, wireless link, infrared link, etc.

Battery sensors (not specifically shown) are coupled to the battery 110 by a link 114. The battery sensors may include analog-to-digital converters, voltage dividers, and other appropriate circuitry, for the purpose of sampling battery voltage, current, and other desired properties. In one implementation, for example, battery voltage may be continuously measured throughout transmit pulses to determine the battery's capacity. Since accurate measurement of battery capacity is best performed during peak load on the battery. In the present implementation, this occurs when the interface 104 transmits messages over the antenna 105. In addition to sampling battery voltage, battery temperature may be used to assist in determining battery capacity, as one option. In this regard, thresholds for end of battery charge and end of battery capacity (discussed below) may be temperature dependent.

Also attached to the controller 102 are various other components, including a timer 118 and one or more registers 120. The timer 118 may comprise a clock, oscillator, or other mechanism for measuring time between events. Alternatively, the controller 102 may utilize a time readout of the GPS receiver 106, in which case the apparatus 100 may omit the timer 118. The register(s) 120 are used to store various statistics used during certain computations of the controller 102, as shown below.

Exemplary Digital Data Processing Apparatus

Figure 2:
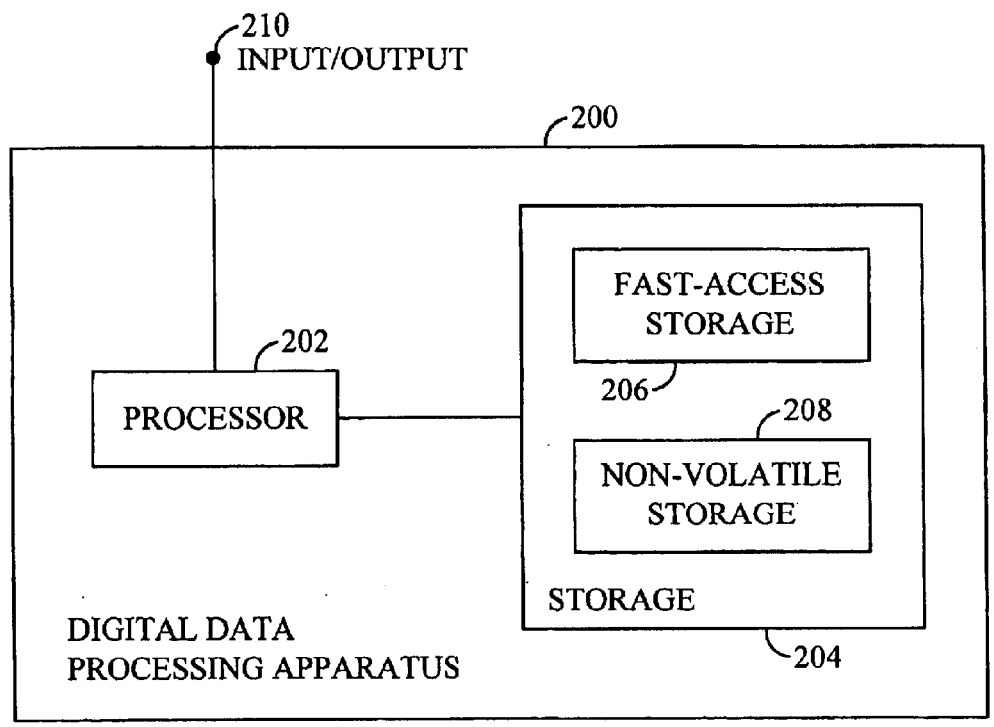
FIG. 2 is a block diagram of a digital data processing machine according to the invention.

As mentioned above, the controller 102 may be implemented in various forms. For instance, the controller 102 may comprise a digital data processing apparatus, as exemplified by the hardware components and interconnections of the digital data processing apparatus 200 of FIG. 2. The apparatus 200 includes a processor 202, such as a microprocessor or other processing machine, coupled to a storage 204. In the present example, the storage 204 includes a fast-access storage 206, as well as nonvolatile storage 208. The fast-access storage 206 may comprise random access memory ("RAM"), and may be used to store the programming instructions executed by the processor 202. The nonvolatile storage 208 may comprise, for example, one or more magnetic data storage disks such as a "hard drive", a tape drive, or any other suitable storage device. The apparatus 200 also includes an input/output 210, such as a line, bus, cable, electromagnetic link, or other means for the processor 202 to exchange data with other hardware external to the apparatus 200.

Despite the specific foregoing description, ordinarily skilled artisans (having the benefit of this disclosure) will recognize that the apparatus discussed above may be implemented in a machine of different construction, without departing from the scope of the invention. As a specific example, one of the components 206, 208 may be eliminated; furthermore, the storage 204 may be provided on-board the processor 202, or even provided externally to the apparatus 200.

Logic Circuitry

In contrast to the digital data processing apparatus discussed previously, a different embodiment of the invention uses logic circuitry instead of computer-executed instructions to implement the controller 102. Depending upon the particular requirements of the application in the areas of speed, expense, tooling costs, and the like, this logic may be implemented by constructing an application-specific integrated circuit ("ASIC") having thousands of tiny integrated transistors. Such an ASIC may be implemented with CMOS, TTL, VLSI, or another suitable construction. Other alternatives include a digital signal processing chip ("DSP"), discrete circuitry (such as resistors, capacitors, diodes, inductors, and transistors), field programmable gate array ("FPGA"), programmable logic array ("PLA"), and the like.

Operation

Having described the structural features of the present invention, the method aspect of the present invention will now be described. Although the present invention has broad applicability to monitoring battery condition and managing battery-powered electrical equipment, the specifics of the structure that has been described is well suited for use with trailer status reporting equipment, and the explanation that follows will emphasize such an application of the invention without any intended limitation.

Signal-Bearing Media

In the context of FIG. 1, such a method may be implemented, for example, by operating the controller 102 (as embodied by a digital data processing apparatus 200) to execute a sequence of machine-readable instructions. These instructions may reside in various types of signal-bearing media. In this respect, one aspect of the present invention concerns a programmed product, comprising signal-bearing media tangibly embodying a program of machine-readable instructions executable by a digital data processor to perform a method to monitor rechargeable battery condition and performance.

Figure 3:
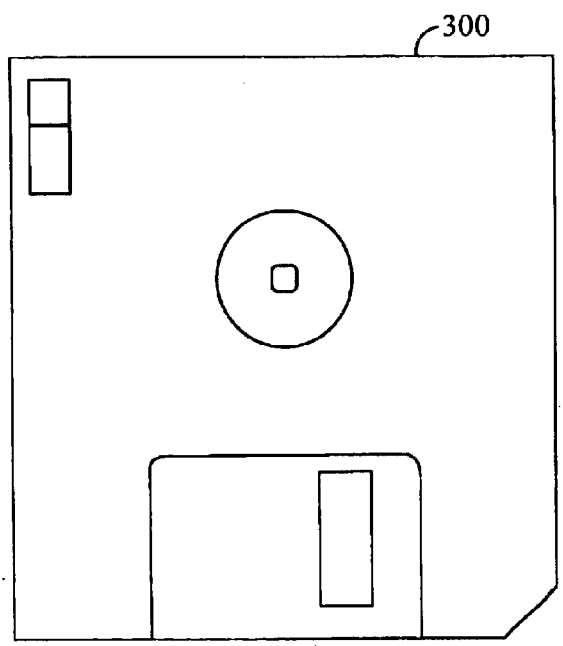
FIG. 3 shows an exemplary signal-bearing medium according to the invention.

This signal-bearing media may comprise, for example, RAM (not shown) contained within the controller 102, as represented by the fast-access storage 206. Alternatively, the instructions may be contained in another signal-bearing media, such as a magnetic data storage diskette 300 (FIG. 3), directly or indirectly accessible by the processor 202. Whether contained in the storage 206, diskette 300, or elsewhere, the instructions may be stored on a variety of machine-readable data storage media, such as direct access storage (e.g., a conventional "hard drive", redundant array of inexpensive disks ("RAID"), or another direct access storage device ("DASD")), magnetic tape, electronic read-only memory (e.g., ROM, EPROM, or EEPROM), optical storage (e.g., CD-ROM, WORM, DVD, digital optical tape), paper "punch" cards, or other suitable signal-bearing media including transmission media such as digital and analog and communication links and wireless. In an illustrative embodiment of the invention, the machine-readable instructions may comprise software object code, compiled from a language such as "C," etc.

Logic Circuitry

In contrast to the signal-bearing medium discussed above, the method aspect of the invention may be implemented using logic circuitry, without using a processor to execute instructions. In this embodiment, the logic circuitry is implemented in the controller 102, and is configured to perform operations to implement the method of the invention. The logic circuitry may be implemented using many different types of circuitry, as discussed above. As still another embodiment of the invention, one component 102a, 102b of the controller 102 may be implemented in logic circuitry with the other component implemented as a digital data processing apparatus.

Overall Sequence of Operation

Figure 4:
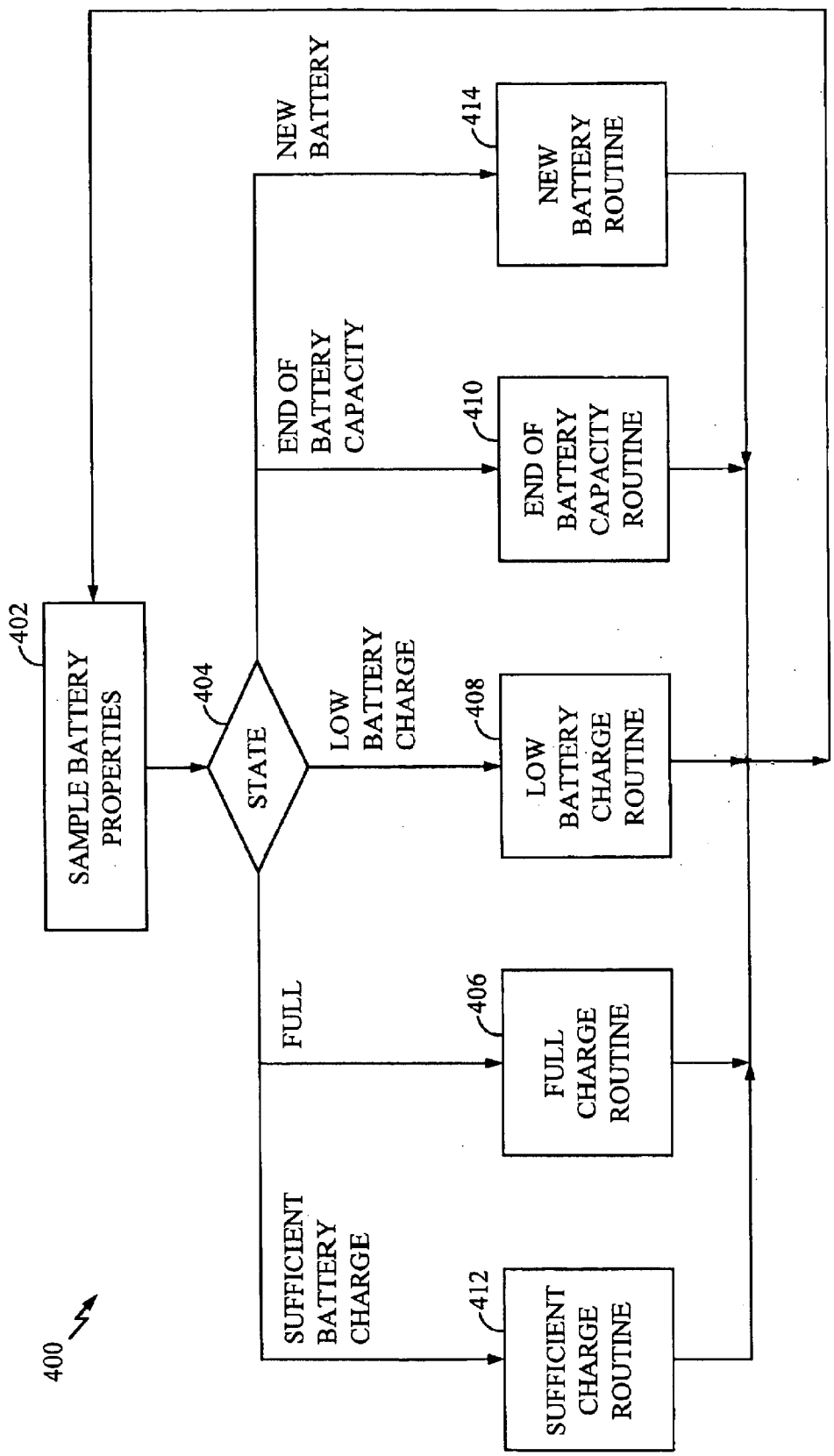
FIG. 4 is a flowchart of an overall battery monitoring sequence according to the invention.

FIG. 4 shows an overall battery monitoring sequence 400 to illustrate one example of the method aspect of the present invention. For ease of explanation, but without any intended limitation, the apparatus 100 is employed as a context for description of FIG. 4, as well as FIGS. 5–10 described below.

In step 402, the controller 102 senses various attributes of the battery 110 and/or its use history. For example, the controller 102 may direct the sensors 112 to sample battery voltage, battery current, battery temperature, and/or other properties representative of battery charge condition. In addition, the controller 102 may consult the registers 120 to determine whether the battery 110 has been newly replaced, as discussed in greater detail below.

After step 402, the controller uses the results of step 402 to evaluate the battery's state (step 404). This evaluation is conducted using certain criteria, described in detail below. Depending upon the battery's state, the controller 102 may initiate a sufficient charge routine 412, full charge routine 406, low battery charge routine 408, end of battery capacity routine 410, or new battery routine 414.

More particularly, if the sampled battery voltage exhibits a "full charge," the controller 102 begins the "full charge" routine 406. A full charge substantially matches the battery's full rated voltage, and indicates that the battery 110 is coupled to a recharging source. As an example, the criteria for determining "full charge" in step 404 may require the battery charge current to reach a predetermined minimum value threshold. In contrast to the full charge routine 406, the controller 102 begins a "low battery charge" routine 408 if battery voltage (as sampled in step 402) falls within a predetermined low-battery-charge range. The low-battery-charge range, for example, may include voltages between about four to ten percent of the battery's rated capacity voltage when measured during maximum battery load. If desired, the low-battery-charge range may be adjusted to account for the battery's temperature. If the sampled voltage falls below the low-battery-charge range, the controller 102 initiates the "end of battery capacity" routine 410. Continuing with the previous example, the controller 102 initiates the routine 410 if the voltage of the battery 110 is less than four percent of its rated capacity voltage when measured during maximum battery load. If desired, the criteria for "end of battery capacity" may also be adjusted to account for the battery's temperature.

If step 404 determines that the battery is newly replaced, step 404 initiates a routine 414. Presence of a new battery may be sensed in various ways. For example, the controller 102 may store a used-battery flag (not shown) in volatile memory, such as the storage 206, during normal operations. If the controller 102 experiences end-of-battery-capacity, this loss of power has the effect of clearing the used-battery flag. Upon power-up, it is assumed that the battery has been replaced. Namely, after restoration of power, the controller 102 encounters a cleared used-battery flag in step 404, triggering the controller 102 to begin the new battery routine 414.

In contrast to the previous alternatives, if the sampled battery voltage does not fall into the full charge, low-battery-charge, end-of-battery-capacity, or new battery categories, the battery has sufficient charge and an appropriate routine 412 is performed. The details of the routines 406, 408, 410, 412, 414 are discussed below. After completion of any one of these routines, the sequence 400 returns to step 402 for battery property re-sampling.

Full Charge Routine

Figure 5:
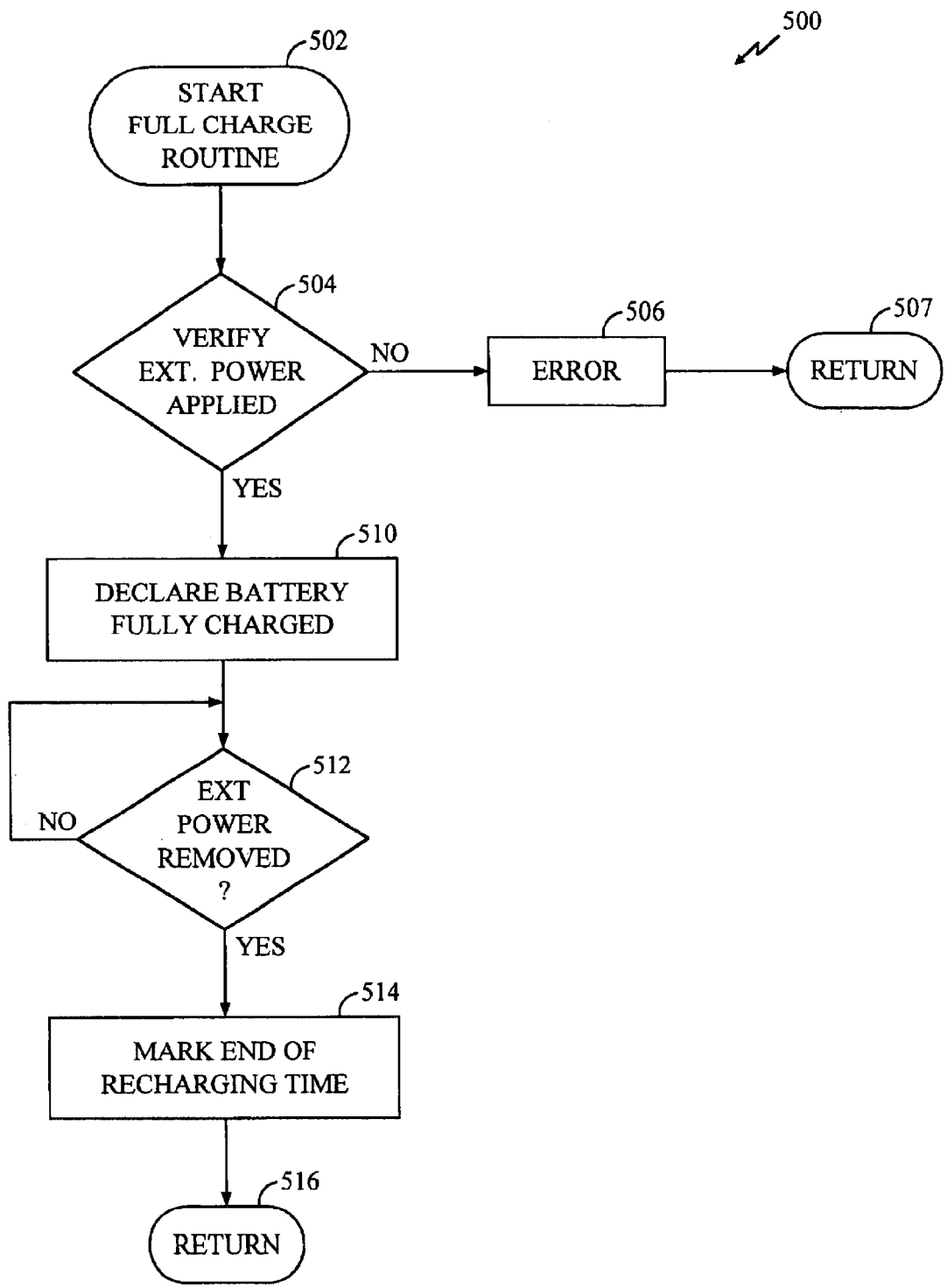
FIG. 5 is a flowchart of a "full charge" routine, according to the invention.

FIG. 5 shows a sequence 500 to illustrate one exemplary embodiment of the full charge routine 406. As mentioned above, the full charge routine 406 is initiated when the sampled battery current corresponds to a full charge, indicating that the battery is being recharged. Accordingly, after the sequence 500 begins in step 502, the controller 102 verifies that the battery 110 is coupled to a recharging source (step 504). This may be achieved, for example, by configuring the connector 130 such that voltage from the recharging source is directed to an appropriate input of the controller 102, such that the controller 102 recognizes the presence or absence of recharging power.

If step 504 finds that the battery 110 is not coupled to a recharging source, then the "full charge" evaluation (from step 404, FIG. 4) is in error. In this case, step 504 advances to step 506, where the controller 102 performs error handling operations such as logging the error, utilizing the interface 104 to transmit an error notification, or other appropriate actions. After step 506, as illustrated, the controller 102 may end the routine 500 (step 507), thereafter returning to the routine 400 for re-sampling of the battery voltage (step 402, FIG. 4).

If step 504 verifies the battery's external power connection, however, the controller 102 proceeds to declare the battery fully charged (step 510). If desired, the controller 102 may store a record of the battery's full charge state in the registers 120, along with the current time from the timer 118. After step 510, the controller 102 waits (step 512) until the recharging source is decoupled from the battery 110. When this occurs, the controller 102 consults the timer 118 to obtain the current time, and stores a record of this time in the registers 120 (step 514). This time may be referred to as the "end-of-recharging" time. Accordingly, the end-of-recharging time marks the time when external power was decoupled from a full charged battery 110. This time is used as a benchmark, as shown below, to measure battery charge deviation over time.

After step 514, the routine ends in step 516, whereupon the routine 500 returns back to step 402 (FIG. 4).

Low Battery Charge Routine

Figure 6:
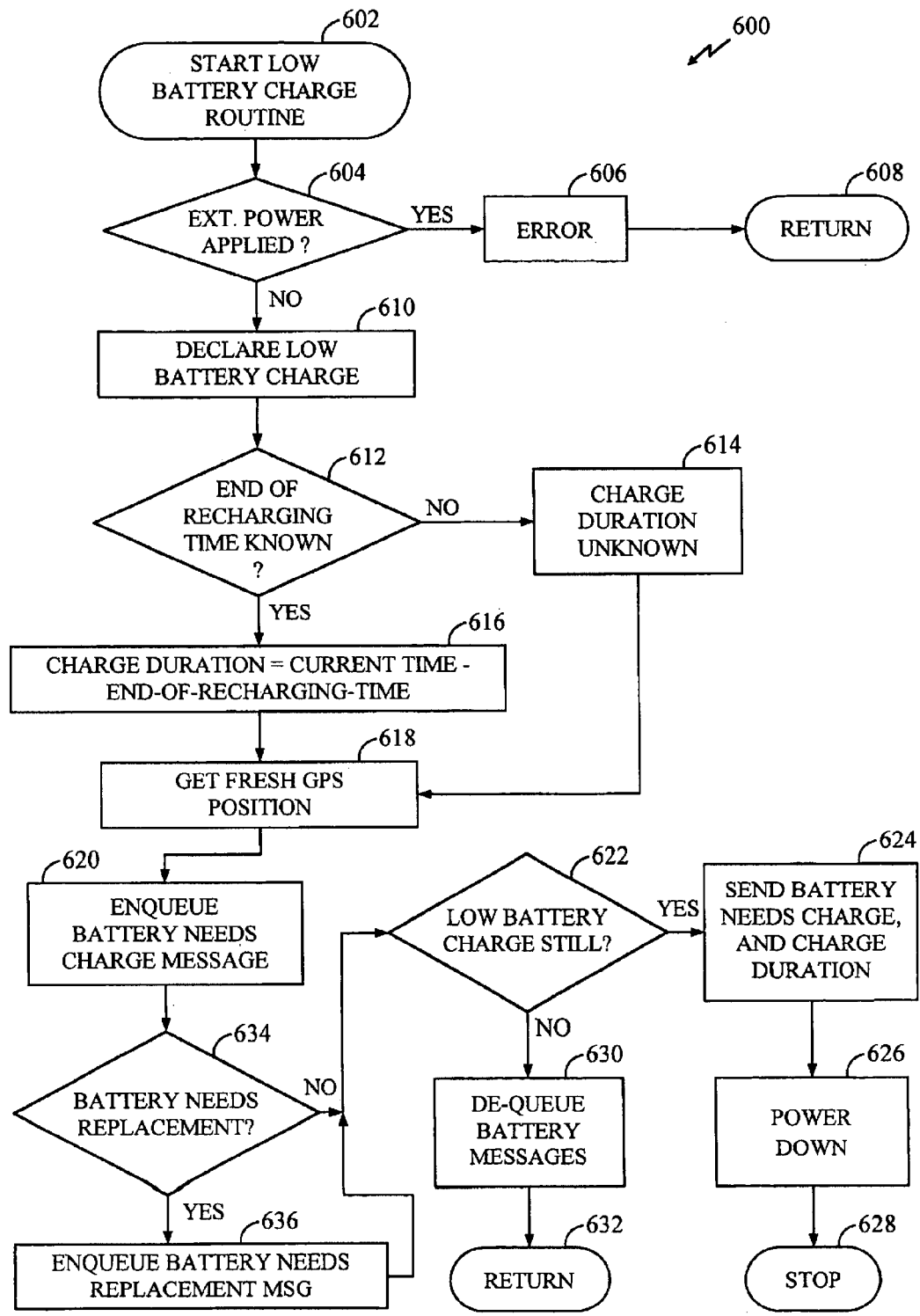
FIG. 6 is a flowchart of a "low battery charge" routine, according to the invention.

FIG. 6 shows a sequence 600 to illustrate one exemplary embodiment of the "low battery charge" routine 408. As mentioned above, the routine 408 is initiated when the sampled battery voltage falls within a predetermined low-battery-charge range, indicating that the battery needs to be recharged.

After the sequence 600 begins in step 602, the controller 102 verifies that the battery 110 is not coupled to a recharging source (step 604). If the battery 110 is coupled to a recharging source, then the "low battery charge" evaluation (from step 404, FIG. 4) is in error. In this case, step 604 advances to step 606, where the controller 102 performs error handling operations such as logging the error, utilizing the interface 104 to transmit an error notification, or other appropriate actions. After step 606, the controller 102 continues monitoring the battery state by resuming the sequence 400 (FIG. 4), as shown by step 608.

If step 604 confirms that the battery 110 is not coupled to a recharging source, the controller 102 proceeds to declare a "low battery charge" condition (step 610). If desired, the controller 102 may store a record of the battery's low charge state in the registers 120, along with the current time from the timer 118. After step 610, the controller 102 determines whether the end-of-recharging time is known (step 612). If the end-of-recharging time is known, the controller 102 computes the battery's charge duration from the end-of-recharging (step 514, FIG. 5) until experiencing the low battery charge (step 610). Namely, a "charge duration" variable is computed by subtracting the end-of-recharging time from the current time from the timer 118 (step 616). On the other hand, this computation is not possible if the end-of-recharging time is unknown, which may occur for example when the apparatus 104 is uncoupled from a recharging source before a "full charge" state is achieved. In this event (step 614), the controller 102 sets the "charge duration" variable to "unknown."

After step 616 (or step 614), the controller 102 optionally consults the GPS receiver 106 to determine the position of the apparatus 100 (step 618). This step is performed in anticipation of transmitting a position-equipped message to a remote site, as shown below. Following step 618, the controller 102 places a "battery needs charge" message in the queue 103 for later transmission to the remote communications site by the interface 104.

After step 620, the controller 102 determines whether the battery needs replacement (step 634). In the illustrated example, this is determined by comparing the "charge duration" variable to a predetermined minimum duration, such as ten days. Thus, if the battery voltage drops from "full charge" (step 510, FIG. 5) to "low battery charge" (step 610, FIG. 6) in ten days or less, it is assumed that the battery is reaching the end of its life. In this case, the controller 102 enqueues a message that the battery needs replacement (step 636).

After step 636, or a negative answer to step 634, step 622 is performed. In step 622, the controller 102 re-samples the battery temperature and voltage and determines whether the sampled temperature/voltage has risen above the low-battery-charge level. Under some cases, the battery may initially exhibit a low charge and then later demonstrate a normal charge; this situation may occur, for example, due to "temperature slew," when the battery experiences a cold temperature at the sampling of step 402 and later warms-up. In this case, where the battery voltage has risen beyond the low-battery-charge range, step 622 advances to step 630, where the controller 102 removes the "needs charge" and "needs replacement" messages from the queue 103. Following step 630, the routine 600 ends in step 632 and returns to the sequence 400 (FIG. 4).

On the other hand, if the battery voltage has not risen beyond the low-battery-charge range, step 622 advances to step 624. In step 624, the controller 102 instructs the interface 104 to transmit the enqueued messages, which include a "battery needs charge" message (from step 620) and may also include a "battery needs replacement" message (from step 636) if applicable. If desired, the controller 102 may also include the computed charge duration from step 616 in this transmission. Transmission of the charge duration assists personnel at the remote site in monitoring battery performance over time. For instance, if the battery's charge duration starts to markedly decrease, the battery might be starting to malfunction or wear out; in this case, precautionary replacement of the battery could help avoid an unexpected battery failure.

As an optional enhancement, step 624 may examine the queue 103 to determine whether there are any battery status messages in the queue that pre-exist the messages from steps 620 and/or 636. These pre-existing messages may have occurred for various reasons. As one example, the battery 110 may have achieved a low-battery-charge state while the interface 104 was outside the range of the remote communications site. As another example, the battery 110 may have achieved the battery-needs-replacement state (discussed below) at some prior time, and then began receiving external power while the interface 104 was outside the range of its remote communications site and was therefore unable to transmit this message. In either of these cases, the battery status message did not get transmitted from the queue 103. To account for this, the controller 102 in step 624 may optionally check for such pre-existing messages and delete any redundant pre-existing messages of the same type. Furthermore, if the battery's current charge duration was unknown (from step 614), the controller 102 may incorporate the known charge durations (if any) from the pre-existing battery status message into the current messages before deleting the redundant, pre-existing message.

After step 624, the controller 102 enters a power conserving mode (step 626). The controller 102 may also store a value, flag, byte, or other distinguishing signal in the register 120 to later show that the apparatus 102 was powered-down. In the power conserving mode, the controller 102 selectively removes electrical power from one or more components in the apparatus 100 (step 626). The type and number of components that are powered-down depend upon the particular requirements of the application, importance of that particular component, and other factors. As an example, step 626 may involve powering-down of the relatively power-consumptive GPS receiver 106 and interface 104. In embodiments where the controller 102 includes a low-power-consuming task manager 102b and a higher-power-consuming main processor 102a (as discussed above), the main processor 102a powers down but the task manager 102b remains "on." For instance, despite entering the power conserving mode, the controller 102 continues to perform steps 402, 404, and 410. Namely, the controller 102 still samples battery voltage (step 402, FIG. 4) and evaluates battery condition (step 404, FIG. 4) in case the "end of battery capacity" routine 410 becomes necessary. As explained below, operation of the apparatus 100 automatically resumes (sequence 800, FIG. 8) when the battery 110 is coupled to a recharging source.

After the selective power-down of step 626, the routine 600 stops (step 628), returning to the sequence 400 (FIG. 4).

End of Battery Capacity Routine

Figure 7:
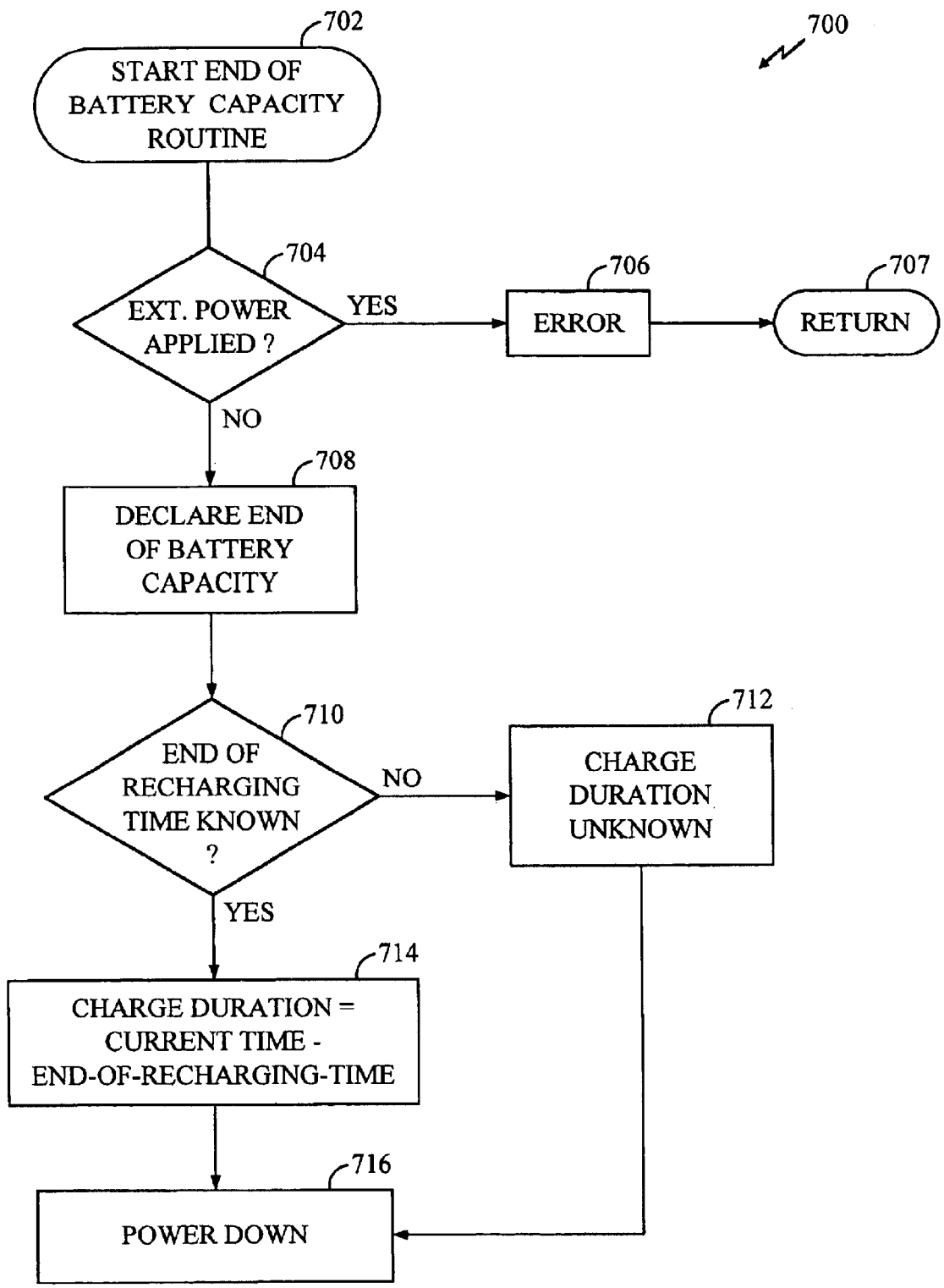
FIG. 7 is a flowchart of an "end of battery capacity" routine, according to the invention.

FIG. 7 shows a sequence 700 to illustrate one exemplary embodiment of the "end of battery capacity" routine 410. The routine 700 begins in step 702, which occurs whenever step 404 (FIG. 4) finds that the battery 110 is nearing the end of its charge. In step 704, the controller 102 verifies that the battery 110 is not coupled to a recharging source. If the battery 110 is coupled to a recharging source, then the "end of battery capacity" evaluation (from step 404, FIG. 4) is in error. In this case, step 704 advances to step 706, where the controller 102 performs error handling operations such as logging the error, utilizing the interface 104 to transmit an error notification, or other appropriate actions. After step 706, the controller 102 continues monitoring the battery state by resuming the sequence 400 (FIG. 4), as shown by step 707.

If step 704 confirms that the battery 110 is not coupled to a recharging source, the controller 102 proceeds to declare an "end of battery capacity" condition (step 708). If desired, the controller 102 may store a record of the battery's state (i.e., end of capacity) in the registers 120, along with the current time.

After step 708, the controller 102 proceeds to determine the charge duration, if possible. Although charge duration might have been previously computed when the battery attained a low charge status (pursuant to the low battery charge routine 600), the routine 700 re-computes the charge duration in case the battery voltage decayed so rapidly to the "end of capacity" condition that the low battery charge routine 600 was not invoked. This situation may arise, for example, in extreme temperature situations or due to the sudden activation of a power-hungry peripheral device in the apparatus 100.

To determine the charge duration, the controller 102 first determines whether the end-of-recharging time is known (step 710). If so, the controller 102 computes the battery's charge duration from end-of-recharging until experiencing the "end of battery capacity" condition (step 714). Namely, the "charge duration" variable is computed by reducing the current time (from the timer 118) by the end-of-recharging time. The controller 102 stores this value in the registers 120, which preserves the charge duration computation since the charge duration may be difficult or impossible to calculate after the apparatus 100 later powers down (step 716, as discussed below). The controller 102 may also store a value, flag, byte, or other distinguishing signal in the register 120 to later show that the apparatus 102 was powered-down. In contrast to step 714, the computation of charge duration is not possible if the end-of-recharging time is unknown. In this event, the controller 102 sets the "charge duration" variable to "unknown" (step 712).

After steps 712 or 714, the controller 102 powers down in step 716, thereby completing the sequence 700. Step 716 helps the apparatus 100 avoid a "hard reset" condition, where the battery 110 runs out of power and the apparatus 100 loses power suddenly. Step 716 may enter the power conserving mode as mentioned above, or a more power-thrifty mode where more (or even all) of the components in the apparatus 100 turn off. As an example, the power-down operation 716 may involve removing power from the main processor 102*a*, interface 104, and GPS receiver 106.

Unlike the power-down occurring in the routine 600 (FIG. 6), after step 716 the controller 102 does not continue to perform steps 402, 404, and 410. In the present illustration, the "always on," lower-power-consumption task manager 102*b* continues to operate in order to perform operations such as monitoring sensors 112 (FIG. 1).

As explained below, however, operation of the apparatus 100 automatically resumes (sequence 800, FIG. 8) when the battery 110 is coupled to a recharging source.

Recharging

Figure 8:
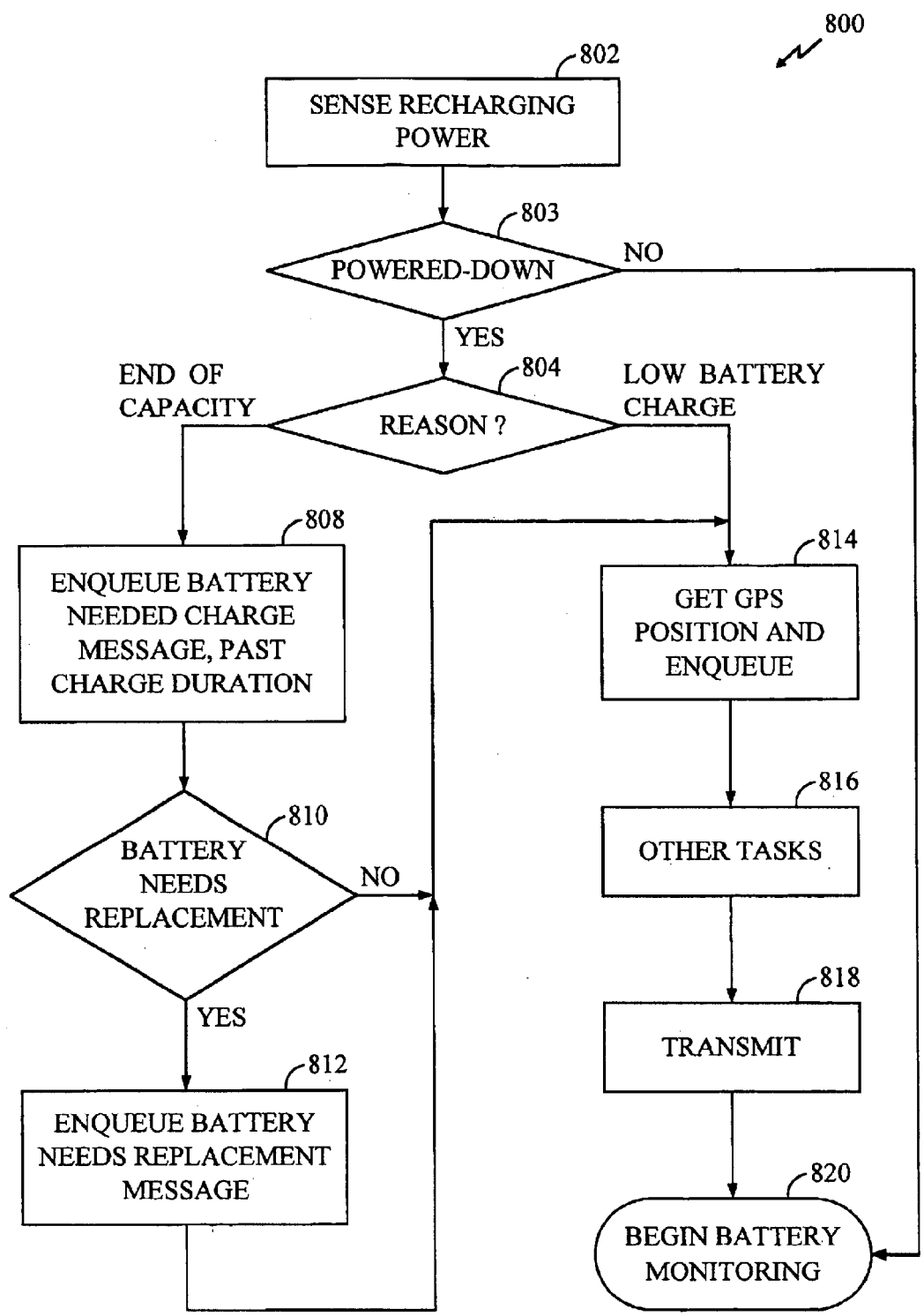
FIG. 8 is a flowchart of a recharging routine, according to the invention.

FIG. 8 illustrates a recharging sequence 800 that is performed whenever the controller 102 detects coupling of the apparatus 100 to a recharging source. In step 802, the controller 102 senses that an external recharging source has been attached to the connector 130. One especially useful technique for implementing step 802 is a hardware interrupt, since the controller 102 may be in a dormant state prior to step 802 after having reached the end of battery capacity as described above in FIG. 7. This hardware interrupt may be facilitated, for example, by configuring the connector 130 such that voltage from the recharging source is automatically directed to a hardware interrupt pin of the controller 102.

The recharging sequence 800 may begin when the controller 102 is conducting normal operations, or when the apparatus 102 has been powered-down. Accordingly, after step 802, the controller 102 determines whether the apparatus 100 was powered-down when recharging began (step 803). A former power-down may be evident, for example, by the presence of certain flags or values in registers 102 stored prior to a power-down event. If the apparatus 100 was not powered-down when recharging started, step 803 advances to step 820, which begins monitoring battery condition by initiating the sequence 400 (FIG. 4).

On the other hand, if the apparatus 100 had been powered down when recharging started, step 804 asks whether the power-down occurred due to an "end of capacity" occurrence or a "low battery charge" event. If the controller 102 had powered down to prevent reaching the end of the battery's capacity, step 804 advances to step 808, which is discussed below. An optional wait state (not shown) may be performed before step 808 in order to build a prescribed charge in the battery before proceeding.

Although this step may be useful in for certain types of charging systems, it may be omitted if not needed.

When step 808 is reached, the controller 102 enqueues a message indicating that the battery formerly needed charging, and including the charge duration computed in step 714 (if available). Transmission of these messages is now helpful because the battery's extremely low voltage prevented the controller 102 from sending any status messages prior to power-down in step 716 (FIG. 7).

After step 808, the controller 102 in step 810 determines whether, at the time of reaching the end of its capacity, the battery 110 needed replacement. In the illustrated example, this is determined by retrieving the most recently computed "charge duration" variable from the registers 120, and comparing the charge duration to a predetermined minimum duration. This predetermined minimum duration may be longer than the minimum duration for reaching "low battery charge" (step 634, FIG. 6), which was ten days as discussed above. As illustrated, if the battery voltage drops from "full charge" (step 510, FIG. 5) to "end of battery capacity" (step 708, FIG. 7) faster than the predetermined minimum time, it is assumed that the battery is reaching the end of its life. If the battery does not need replacement, step 810 advances to step 814, discussed below.

If the battery requires replacement, however, the controller 102 enqueues a message that the battery needs replacement (step 812). Then, after step 812 the controller 102 progresses to step 814, which is also performed after a "low battery charge" answer to step 804. In step 814, the controller 102 queries the GPS receiver 106 for an output representing the geographical location of the apparatus 100, and then enqueues a representative message. Next, in step 816, the controller 102 performs other tasks appropriate to resuming normal operations of the apparatus 100. For instance, the controller 102 may apply power to electrical components that had been turned off, etc. Following step 816, the controller 102 directs the interface 104 to transmit all enqueued messages to the remote site (step 818). After step 818, the routine 800 ends in step 820, where the controller 102 returns to the sequence 400 (FIG. 4) and resumes battery monitoring.

Sufficient Charge Routine

Figure 9:
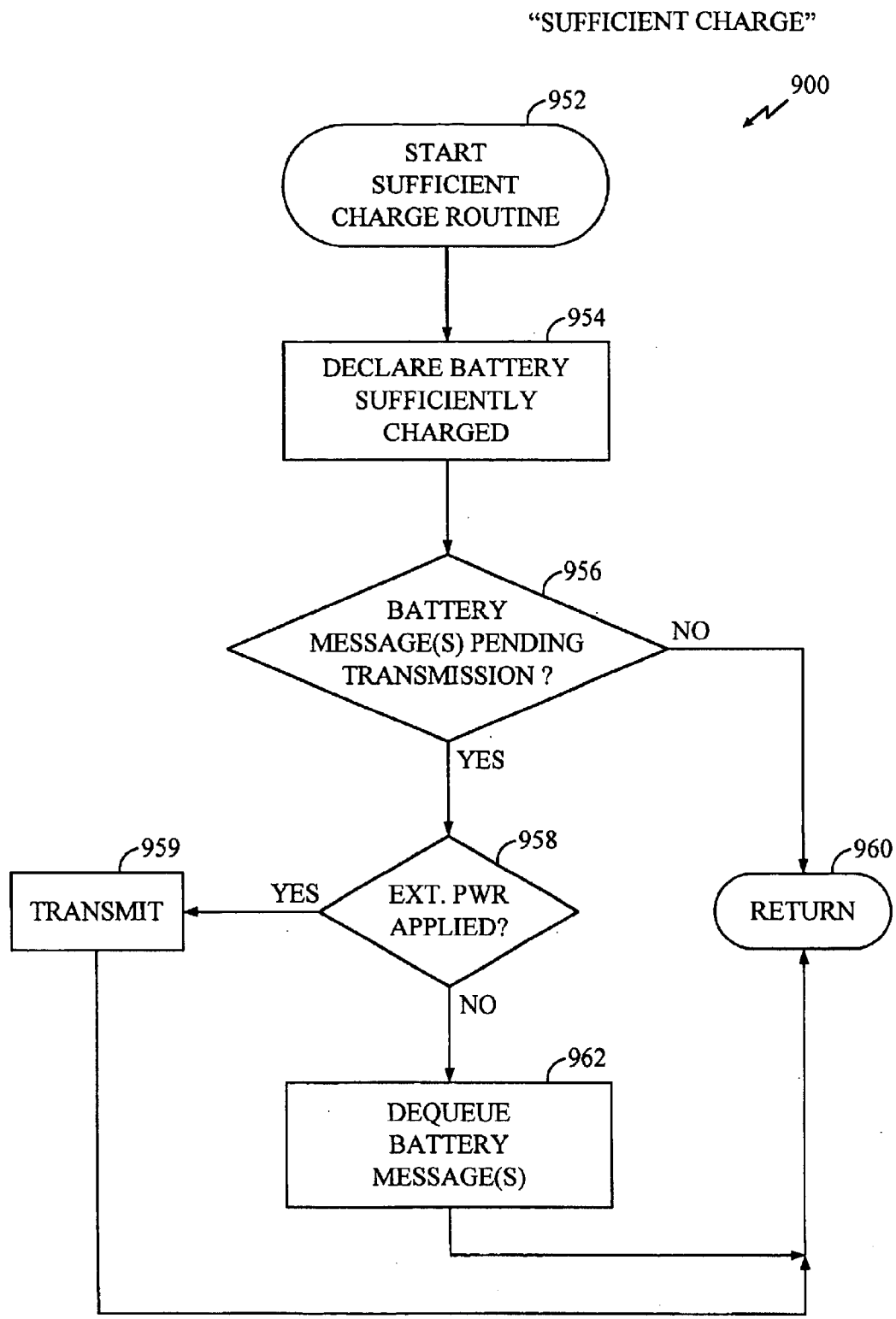
FIG. 9 is a flowchart of a "sufficient charge" routine, according to the invention.

FIG. 9 illustrates a sequence 900 that is performed whenever the battery does not satisfy any of the full-charge, low-battery-charge, end-of-battery capacity, or new battery conditions. The sequence 900, shown as step 412 in FIG. 4, is initiated by the controller 102 after step 404. After the sequence 900 begins in step 952, the controller 102 declares the battery 110 to be sufficiently charged (step 954). If desired, the controller 102 may store a record of the battery's sufficient charge state in the registers 120, along with any other pertinent information such as the current time from the timer 118.

After step 954, the controller 102 in step 956 determines whether there are any battery messages in the queue 103, such as a low-battery-charge message or an end-of-battery capacity message. If not, the routine 900 returns to step 402 in FIG. 4, as shown by step 960.

If there are queued battery messages, then step 956 advances to step 958, which determines whether the apparatus 100 is coupled to an external source of recharging power. If so, the controller 102 directs the interface 104 to transmit the queued message(s) in step 959. The queued messages may have arisen, for example, from steps 620/636 (FIG. 6) and their transmission in step 624 was interrupted by application of recharging power, triggering the routine 800 (FIG. 8). After step 959, the routine 900 returns in step 960. On the other hand, if step 958 finds that external power is not applied, then the queued battery messages are assumed to be in error since the battery presently exhibits sufficient charge. In this case, the controller 102 de-queues the queued battery messages (step 962) and then returns in step 960.

New Battery Routine

Figure 10:
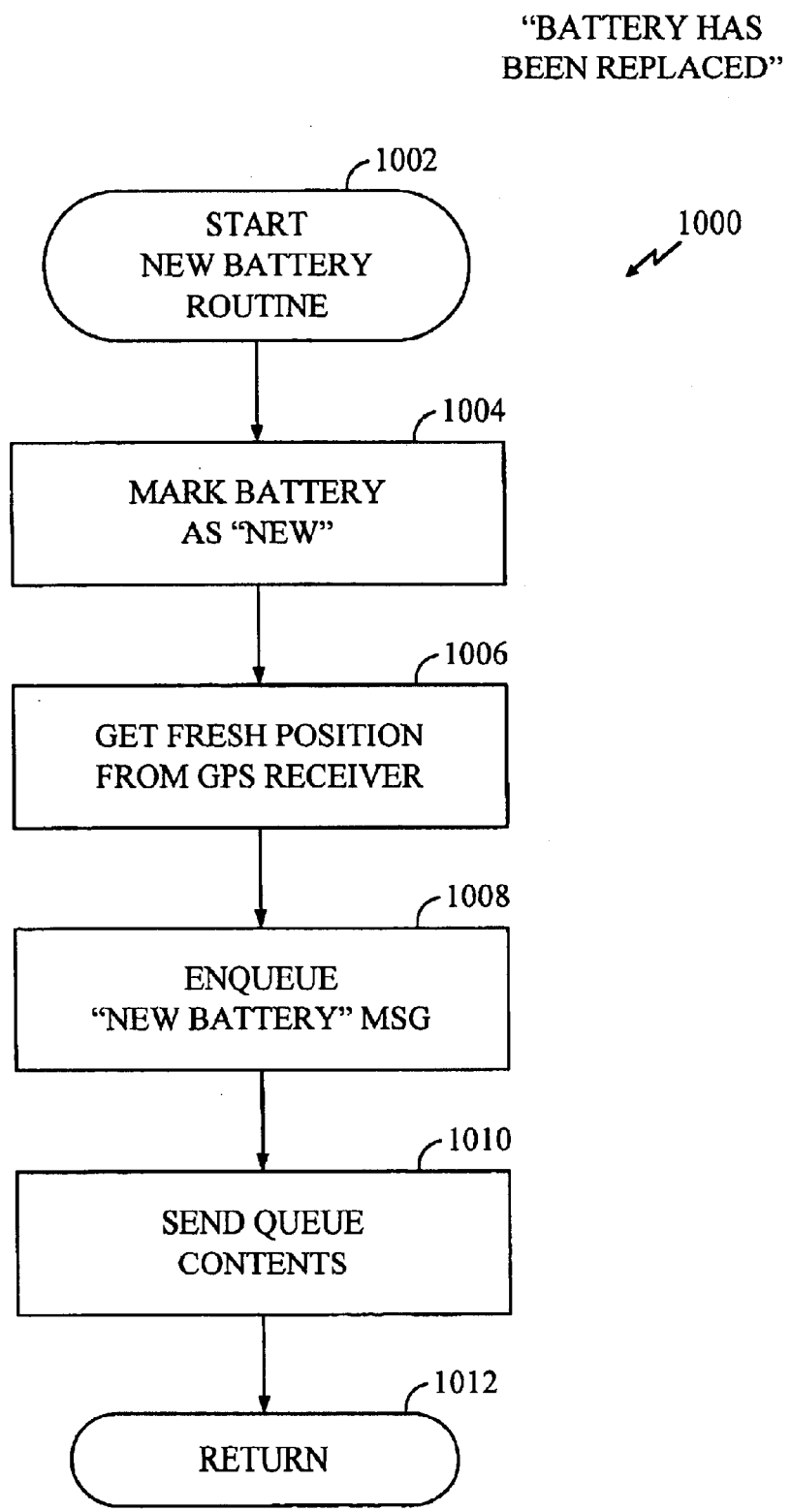
FIG. 10 is a flowchart of a "new battery" routine, according to the invention.

FIG. 10 illustrates a sequence 1000 that is performed whenever the controller 102 detects (step 404, FIG. 4) installation of a new battery. After the routine 1000 begins in step 1002, the controller 102 declares the battery to be "new" (step 1004). If desired, the controller 102 may store a record of the battery's new status in the registers 120, along with any other pertinent information such as the current time from the timer 118. After step 1004, the controller 102 consults with the GPS receiver 106 to obtain the geographic position of the apparatus 100 (step 1006)

Next, the controller 102 makes a queue 103 entry including a Anew battery message along with the GPS-determined position of the apparatus 100. In step 1010, the controller 102 directs the interface 104 to transmit the contents of the queue 103. Finally, the routine 1000 ends in step 1012.

Other Embodiments

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated. Additionally, ordinarily skilled artisans will recognize that operational sequences must be set forth in some specific order for the purpose of explanation and claiming, but the present invention contemplates various changes beyond such specific order.

We claim:

1. A method of managing a rechargeable battery coupled to one or more power-consuming electrical components, comprising operations of:
    monitoring a battery charge;
    monitoring a battery charge duration;
    responsive to a low-battery-charge condition, performing needs-charge operations including initiating transmission of a battery-needs-charge message to a remote site and powering-down a first group including at least some of the electrical components;
    responsive to an end-of-battery-capacity condition, performing end-of-capacity operations including powering-down a second group including at least some of the electronic components; and
    determining whether battery charge duration exceeds a predetermined minimum duration, and if not, transmitting a battery-needs-replacement message to the remote site.

2. The method of claim 1, the end-of-capacity operations comprising:
    preventing the transmission of any messages to the remote site;
    powering-down substantially all of the electronic components; and
    responsive to application of a recharging source to the battery, determining whether a most-recently measured battery charge duration is less than the predetermined minimum duration, and if so, initiating transmission of a battery-needs-replacement message to the remote site.

3. The method of claim 2, the end-of-capacity operations comprising:
    responsive to the application of the recharging source to the battery, initiating transmission of a battery-needed-charge message to the remote site.

4. The method of claim 2, the operations further comprising:
    the remote site receiving a battery-needs-replacement message;
    responsive to the battery-needs-replacement message, analyzing physical properties of the battery to estimate remaining battery life;
    if the remaining battery life exceeds a predetermined end-of-battery-life benchmark, decreasing the predetermined minimum duration; and
    if the remaining battery life does not exceed the predetermined end-of-battery-life benchmark, increasing the predetermined minimum duration.

5. The method of claim 1, where:
    the low-battery-charge condition comprises battery charge being less than a predetermined needs-charge level and greater than a predetermined end-of-capacity level; and
    the end-of-battery-capacity condition comprises battery charge less than the end-of-capacity level.

6. The method of claim 1, where:
    the low-battery-charge condition comprises battery charge being no greater than a predetermined needs-charge level;
    the operations further comprise, after detecting the low-battery-charge condition, redetecting battery charge, and only if redetected battery charge exceeds the predetermined needs-charge level upon redetection, aborting the needs-charge operations.

7. The method of claim 1, where:
    the operation of monitoring battery charge duration comprises measuring a time for each battery charge to deplete from a first level to a second level;
    the operations further comprise, responsive to battery charge duration being less than the predetermined minimum duration, redetecting battery charge and only if redetected battery charge exceeds the second level, aborting the transmission of the battery-needs-replacement message to the remote site.

8. The method of claim 1, the operation of monitoring battery charge duration comprising:
    sensing coupling of a recharging source to the battery;
    responsive to the recharging source being decoupled from the battery, noting a time of the decoupling; and
    responsive to battery charge depleting to a predetermined level, noting a time of such depletion; and
    computing a period of time occurring between the decoupling and depletion times.

9. The method of claim 1, the operations further comprising:
including in each transmission to the remote site a time since the battery was last connected to a recharging source.

10. The method of claim 1, the operations comprising:
including in each transmission to the remote site a geographical position of the battery.

11. The method of claim 1, where the operation of transmitting a battery-needs-charge message comprises:
placing a battery-needs-charge message in a message queue for subsequent transmission to the remote site;
responsive to detecting application of a recharging source to the battery prior to transmission of the battery-needs-charge message, deleting the battery-needs-charge message from the queue.

12. The method of claim 1, further comprising:
detecting indicia of battery replacement and responsive thereto, initiating transmission of a new-battery message to the remote site.

13. The method of claim 1, further comprises:
responsive to detecting battery condition exceeding the low-battery-charge and end-of-capacity conditions, preventing transmission of any untransmitted messages regarding battery charge condition.

14. A signal-bearing medium tangibly embodying a program of machine-readable instructions executable by a digital processing apparatus to perform operations for managing a rechargeable battery coupled to one or more power-consuming electrical components, the operations comprising:
monitoring a battery charge;
monitoring a battery charge duration;
responsive to a low-battery-charge condition, performing needs-charge operations including initiating transmission on a battery-needs-charge message to a remote site and powering-down a first group including at least some of the electrical components;
responsive to an end-of-battery-capacity condition, performing end-of-capacity operations including powering-down a second group including at least some of the electronic components; and
determining whether battery charge duration exceeds a predetermined minimum duration, and if not, transmitting a battery-needs-replacement message to the remote site.

15. The medium of claim 14, the end-of-capacity operations comprising:
preventing the transmission of any messages to the remote site;
powering-down substantially all of the electronic components; and
responsive to application of a recharging source to the battery, determining whether a most-recently measured battery charge duration is less than the predetermined minimum duration, and if so, initiating transmission of a battery-needs-replacement message to the remote site.

16. The medium of claim 15, the end-of-capacity operations comprising:
responsive to the application of the recharging source to the battery, initiating transmission of a battery-needed-charge message to the remote site.

17. The medium of claim 14, where:
the low-battery-charge condition comprises battery charge being less than a predetermined needs-charge level and greater than a predetermined end-of-capacity level; and
the end-of-battery-capacity condition comprises battery charge less than the end-of-capacity level.

18. The medium of claim 14, where:
the low-battery-charge condition comprises battery charge being no greater than a predetermined needs-charge level;
the operations further comprise, after detecting the low-battery-charge condition, redetecting battery charge, and only if redetected battery charge exceeds the predetermined needs-charge level upon redetection, aborting the needs-charge operations.

19. The medium of claim 14, where:
the operation of monitoring battery charge duration comprises measuring a time for each battery charge to deplete from a first level to a second level;
the operations further comprise, responsive to battery charge duration being less than the predetermined minimum duration, redetecting battery charge and only if redetected battery charge exceeds the second level, aborting the transmission of the battery-needs-replacement message to the remote site.

20. The medium of claim 14, the operation of monitoring battery charge duration comprising:
sensing coupling of a recharging source to the battery;
responsive to the recharging source being decoupled from the battery, noting a time of the decoupling; and
responsive to battery charge depleting to a predetermined level, noting a time of such depletion; and
computing a period of time occurring between the decoupling and depletion times.

21. The medium of claim 14, the operations further comprising:
including in each transmission to the remote site a time since the battery was last connected to a recharging source.

22. The medium of claim 14, the operations comprising:
including in each transmission to the remote site a geographical position of the battery.

23. The medium of claim 14, where the operation of transmitting a battery-needs-charge message comprises:
placing a battery-needs-charge message in a message queue for subsequent transmission to the remote site;
responsive to detecting application of a recharging source to the battery prior to transmission of the battery-needs-charge message, deleting the battery-needs-charge message from the queue.

24. The medium of claim 14, the operations further comprising:
detecting indicia of battery replacement and responsive thereafter, initiating transmission of a new-battery message to the remote site.

25. A battery monitoring apparatus, comprising:
one or more battery property sensors;
a timer;
a transmitter; and
a controller, coupled to the sensors and the timer and the transmitter, the controller programmed to manage a rechargeable battery coupled to one or more power-consuming electrical components, by performing operations comprising:

directing the sensors to monitor a battery charge;
monitoring a battery charge duration utilizing the timer;
responsive to a low-battery-charge condition, performing needs-charge operations including:
  initiating transmission of a battery-needs-charge message to a remote site; and
  powering-down a first group including at least some of the electrical components;
responsive to an end-of-battery-capacity condition, performing end-of-capacity operations including powering-down a second group of the electronic components;
determining whether battery charge duration exceeds a predetermined minimum duration, and if not, initiating transmission of a battery-needs-replacement message to the remote site.

26. The apparatus of claim 25, where:
the controller includes first and second processors with the first processor consuming less power than the second processor;
the operations of powering-down the first group being performed by the first processor, and the second processor being in the first group;
the operations of powering-down the second group being performed by the first processor, and the second processor being in the second group.

27. A logic circuit of multiple interconnected electrically conductive elements configured to perform operations for monitoring a rechargeable battery coupled to one or more power-consuming electrical components, the operations comprising:
monitoring a battery charge;
monitoring a battery charge duration;
responsive to a low-battery-charge condition, performing needs-charge operations including initiating transmission of a battery-needs-charge message to a remote site and powering-down at least some of the electrical components;
responsive to an end-of-battery-capacity condition, performing end-of-capacity operations including powering-down all of the electronic components; and
determining whether battery charge duration exceeds a predetermined minimum duration, and if not, transmitting a battery-needs-replacement message to the remote site.

28. A battery monitoring apparatus, comprising:
sensor means for sensing one or more battery properties;
timing means for providing a time reference signal;
transmitter means for transmitting signals; and
controller means, coupled to the sensor means and the timing means and the transmitter means, for managing a rechargeable battery coupled to one or more power-consuming electrical components by:
  directing the sensor means to monitor battery charge;
  monitoring battery charge duration utilizing the timer means;
  responsive to a low-battery-charge condition, performing needs-charge operations including:
    initiating transmission of a battery-needs-charge message to a remote site; and
    powering-down at least some of the electrical components;
  responsive to an end-of-battery-capacity condition, performing end-of-capacity operations including powering-down all of the electronic components; and
  determining whether battery charge duration exceeds a predetermined minimum duration, and if not, initiating transmission of a battery-needs-replacement message to the remote site.

* * * * *

UNITED STATES PATENT AND TRADEMARK OFFICE
CERTIFICATE OF CORRECTION

PATENT NO.      : 7,024,321 B1
APPLICATION NO. : 09/619863
DATED           : April 4, 2006
INVENTOR(S)     : Deninger et al.

It is certified that error appears in the above-identified patent and that said Letters Patent is hereby corrected as shown below:

Title Page

In section (75) inventorship, please add the below co-inventor to above patent.

(75) - - Vaughn J. Brazerol, Ramona, CA (US) - -

Signed and Sealed this

Twenty-ninth Day of August, 2006

JON W. DUDAS
*Director of the United States Patent and Trademark Office*